United States Patent
Zhang et al.

(10) Patent No.: US 6,788,726 B2
(45) Date of Patent: Sep. 7, 2004

(54) EXTERNAL CAVITY LASER WITH HIGH SPECTRAL PURITY OUTPUT

(75) Inventors: Guangzhi Z. Zhang, San Jose, CA (US); Carter F. Hand, Los Altos, CA (US); Alejandro D. Farinas, Mountain View, CA (US); Murray Reed, Menlo Park, CA (US)

(73) Assignee: New Focus, Inc., San Jose, CA (US)

( * ) Notice: Subject to any disclaimer, the term of this patent is extended or adjusted under 35 U.S.C. 154(b) by 102 days.

(21) Appl. No.: 10/086,137

(22) Filed: Feb. 26, 2002

(65) Prior Publication Data

US 2003/0161378 A1 Aug. 28, 2003

(51) Int. Cl.[7] .................................................. H01S 3/08
(52) U.S. Cl. ...................................... 372/102; 372/107
(58) Field of Search ........................... 372/102, 20, 22, 372/19, 107, 45, 93, 98, 108, 97, 99, 101, 103, 105, 106

(56) References Cited

U.S. PATENT DOCUMENTS

| | | | | |
|---|---|---|---|---|
| 3,938,058 A | * | 2/1976 | Yamamoto | 372/20 |
| 4,243,877 A | * | 1/1981 | Cruz | 250/206.2 |
| 4,594,000 A | * | 6/1986 | Falk et al. | 356/5.09 |
| 4,687,916 A | * | 8/1987 | Emoto et al. | 250/201.5 |
| 5,114,226 A | * | 5/1992 | Goodwin et al. | 356/4.09 |
| 5,226,050 A | * | 7/1993 | Burghardt | 372/20 |
| 5,432,807 A | * | 7/1995 | Okazaki et al. | 372/22 |
| 5,491,714 A | * | 2/1996 | Kitamura | 372/92 |
| 5,809,048 A | * | 9/1998 | Shichijyo et al. | 372/32 |
| 5,852,627 A | * | 12/1998 | Ershov | 372/108 |
| 5,862,162 A | * | 1/1999 | Maeda | 372/20 |
| 5,917,849 A | * | 6/1999 | Ershov | 372/102 |
| 6,100,516 A | * | 8/2000 | Nerin et al. | 250/206.2 |
| 6,108,355 A | * | 8/2000 | Zorabedian | 372/20 |
| 6,243,170 B1 | * | 6/2001 | Ershov | 356/519 |
| 6,317,203 B1 | * | 11/2001 | Wakabayashi et al. | 356/237.1 |
| 6,359,693 B2 | * | 3/2002 | Smith et al. | 356/519 |
| 6,404,798 B1 | | 6/2002 | Leckel et al. | |
| 6,430,323 B1 | * | 8/2002 | Kokkelink et al. | 385/11 |
| 6,526,071 B1 | * | 2/2003 | Zorabedian et al. | 372/20 |

OTHER PUBLICATIONS

Carl E. Wieman "Using Diode Lasers for Atomic Physics" Review Article, Rev. Sci. Instrum 62(1). Jan. 1991; pp 1–20.
Leckel, et al., "Impact of Source Spontaneous Emission (SSE) on the Measurement of DWDM Components" Trends in Optics and Photonics, Tops vol. 37, Mar. 7–10, 2002, pp 31–33.
Fulop et al., "High Power A–S–E–free Tunable Laser Using a Sagnac Ring Interferometer within the External Cavity" Optical Fiber Communication Conference and Exhibit, Mar. 17–22, 2001 Technical Digest, TuJ6–1–3.

\* cited by examiner

*Primary Examiner*—Don Wong
*Assistant Examiner*—Tuan N. Nguyen
(74) *Attorney, Agent, or Firm*—Law Office of Alan W. Cannon

(57) ABSTRACT

A laser apparatus and method that provide for suppression of source spontaneous emission (SSE) and amplified spontaneous emission (ASE) light in laser output with minimal intracavity loss. The apparatus comprises a gain medium emitting a light beam, a wavelength element positioned in the light beam, and a non-reciprocal pickoff positioned in the light beam between the gain medium and wavelength element. The non-reciprocal pickoff may comprise a polarization-dependent beam splitter and a non-reciprocal polarization rotator positioned in the light beam before the wavelength selection element. The non-reciprocal pickoff may further comprise a reciprocal polarization rotator positioned in the light beam after the polarization-dependent beam splitter. The method may comprise emitting a light beam from a gain medium outward along an optical path, allowing the outward light beam to interact with a tunable element, returning a spectrally cleaned light beam along the optical path to the gain medium from the tunable element, and non-reciprocally picking off a portion of the returning, spectrally cleaned light beam from the optical path and directing the portion along an output path.

38 Claims, 3 Drawing Sheets

EXTERNAL CAVITY LASER WITH HIGH SPECTRAL PURITY OUTPUT

BACKGROUND OF THE INVENTION

Frequency tunable semiconductor diode lasers provide versatile optical tools for telecommunications, metrology, spectroscopy and other uses. Many such tunable lasers use a diffraction grating with a movable reflector to select a desired wavelength from the beam diffracted by the grating. A diode gain medium is employed that has an antireflection (AR) coating on one facet thereof Light emitted from the AR coated facet is diffracted by a grating and directed to a movable reflector, which feeds light back to the grating and gain medium. Rotational movement of the reflector with respect to a pivot point selects the wavelength diffracted by the grating and allows the laser to be tuned to a desired output wavelength. Translational motion of the reflector is frequently employed in conjunction with the rotational motion to couple the cavity optical path length to the selected wavelength and provide mode-hop free tuning. Grating-tuned external cavity lasers are typically arranged in the Littman-Metcalf configuration with a "folded cavity", which permits compact-sized external cavity laser devices suitable for many commercial uses.

The optical output of grating-tuned external cavity lasers of this sort may be collected as the light emitted from a rear, partially reflective facet of the gain medium, or as the grating reflection of light directly from the gain medium. This provides a relatively high output power, but includes "noise" in the form of source spontaneous emission (SSE) and amplified spontaneous emission (ASE) from the gain medium. One approach to providing a spectrally "clean" output from grating-tuned external cavity lasers has been to simply insert a beam coupler directly into the laser cavity between the grating and gain medium. A partially reflective surface on the beam coupler directs a portion of the light returning from the grating outside the cavity. This partially reflected light is at the selected wavelength and has been spatially separated from the propagation direction of the spontaneous emission light by the grating. This spectrally clean output may then be coupled into a fiber for use in applications requiring high spectral purity.

This relatively simple approach to providing a spectrally pure output beam has an important drawback: the partially reflective surface of the beam coupler has the disadvantage of reciprocity. As a simple mirror, the beam coupler simultaneously reflects an equal portion of the beam traveling from the gain medium towards the grating. The insertion of a conventional beam coupler into the laser cavity thus always results in an optical loss from the opposite reflection off the partially reflective surface of the beam coupler from the spectrally cleaned light that is collected and use. The spectral cleansing provided by beam couplers thus is obtained with a corresponding sacrifice in laser output power.

There are many uses for external cavity lasers having output with high spectral purity, including medical, metrological and optical communications areas. The low power of currently available spectrally pure laser output has, however, limited the commercial use of external cavity lasers in these areas. There is accordingly a need for an external cavity laser apparatus that provides suppression of spontaneous emission light from laser output without significant optical loss, and which is simple, compact and inexpensive in design. The present invention satisfies these needs, as well as others, and overcomes the deficiencies found in the background art.

SUMMARY

The invention is a laser apparatus and method that provides for suppression of source spontaneous emission (SSE) and amplified spontaneous emission (ASE) light in laser output with minimal intracavity loss. The apparatus comprises, in general terms, a gain medium emitting a light beam, a wavelength selection element positioned in the light beam, and a non-reciprocal pickoff positioned in the light beam to receive light returning from the wavelength selection element to the gain medium. The wavelength selection element may be tunable.

The non-reciprocal pickoff may comprise a linear polarizer positioned in the light beam, together with a non-reciprocal polarization rotator positioned in the light beam after the polarization-dependent beam splitter. The non-reciprocal pickoff may further comprise a reciprocal polarization rotator positioned in the light beam after the polarization-dependent beam splitter. The non-reciprocal polarization rotator and the reciprocal polarization rotator may be balanced with respect to each other, such that the non-reciprocal polarization rotator and the reciprocal polarization rotator each define substantially equal angles of polarization rotation. The rotators are configured to cancel out each other's rotational effect on the polarization orientation of outward-bound light from the gain medium towards the wavelength selection element, and to produce an additive rotational effect on light returning towards the gain medium from the wavelength selection element. In certain embodiments, the gain medium and the polarization-dependent beam splitter may be angularly positioned with respect to each other at an angle that is equal or substantially equal to the angle of rotation defined by the non-reciprocal rotator, such that the gain medium and polarization-dependent beam splitter effectively provide the effect of a reciprocal polarization rotator.

The invention also provides methods of laser operation that comprise, in general terms, emitting a light beam from a gain medium along an optical path, positioning a wavelength selection element in the optical path, positioning a non-reciprocal pickoff in the optical path, feeding spectrally clean light back to the gain medium by the wavelength selection element, and picking off, by the non-reciprocal pickoff, a portion of spectrally clean light traveling the optical path towards the gain medium. The non-reciprocal pickoff may be positioned between the gain medium and the wavelength selection element. The positioning of the non-reciprocal pickoff may comprise positioning a polarization-dependent beam splitter in the optical path between the gain medium and the wavelength selection element, and positioning a non-reciprocal polarization rotator in the optical path between the polarization-dependent beam splitter and the wavelength selection element.

In certain embodiments the methods may comprise angularly positioning the polarization-dependent beam splitter and the gain medium with respect to the non-reciprocal polarization rotator at an angle that is substantially equal to the angle of polarization rotation defined by the non-reciprocal polarizer. The positioning of the non-reciprocal pickoff may, in other embodiments, comprise positioning a reciprocal polarization rotator in the optical path between the polarization-dependent beam splitter and the wavelength selection element. The methods may additionally comprise positioning a reflector in the optical path after the tuning element. In certain embodiments, the methods may further comprise defining an external laser cavity between the reflector and a reflective facet of the gain medium.

The invention also provides methods for generating spectrally clean laser output which, in general terms, comprise emitting a light beam from a gain medium outward along an optical path, allowing the outward traveling light beam to interact with a wavelength selection element, returning a spectrally cleaned light beam along the optical path to the gain medium from the wavelength selection element, and non-reciprocally picking off a portion of the returning, spectrally cleaned light beam from the optical path.

The non-reciprocally picking off may comprise passing the outward light beam through a linear polarizer such as a polarization-dependent beam splitter to linearly polarize the light beam, rotating the polarization orientation of spectrally clean light that is returned to the polarization-dependent beam splitter, and reflecting along an output path, by the polarization-dependent beam splitter, a portion of the returning light. The rotating may comprise passing the outward light beam and return light beam through a non-reciprocal polarization rotator. In other embodiments, the rotating may comprise passing the outward traveling light beam and return light beam through a non-reciprocal polarization rotator and a reciprocal polarization rotator.

Passing the outward light beam through the non-reciprocal polarization rotator and the reciprocal polarization rotator may comprise rotating, by the non-reciprocal polarization rotator, the polarization orientation of the outward light beam by an amount equal to +θ, and rotating, by the reciprocal polarization rotator, the polarization orientation of the outward light beam by an amount equal to −θ, such that zero net rotation is imparted to the outward light beam by the combined action of the non-reciprocal and reciprocal polarization rotators.

Passing the returning, spectrally cleaned light beam through the non-reciprocal polarization rotator and the reciprocal polarization rotator may comprise rotating, by the reciprocal polarization rotator, polarization orientation of the outward light beam by an angle +θ, and rotating, by the non-reciprocal polarization rotator, the polarization orientation of the outward light beam by an angle +θ, such that the combined effect of the non-reciprocal and reciprocal polarization rotators imparts a net rotation of +2θ to the light returning from the wavelength selection element to the gain medium. Since the returning light beam has a polarization that has been angularly rotated with respect to the outward light beam, the returning light beam can be non-reciprocally picked off at the polarization-dependent beam splitter with minimal optical loss.

By way of example, and not of limitation, the gain medium may comprise a diode emitter or a flash-lamp pumpable or electrically pumpable crystal, dye, gas or other gain medium. The polarization-dependent beam splitter may comprise a thin film dielectric polarizer plate, a dichroic polarizer, a sheet polarizer, or other linear polarizer element. The non-reciprocal rotator may comprise a Faraday rotator or other magneto-optic or electro optic non-reciprocal rotator, or other device capable of non-reciprocal light polarization. The wavelength selection element may be tunable, and may comprise a grating, a thin film interference filter, a solid or gas etalon, an electro-optic element, a liquid crystal device, or other element capable of providing wavelength selection to light fed back to the gain medium. The reciprocal rotator may be balanced or substantially balanced with respect to the non-reciprocal rotator.

The invention may be embodied in a grating-tuned external cavity laser with an intracavity non-reciprocal pickoff in accordance with the invention. The external cavity laser apparatus may comprise, for example, a diode gain medium with a first, antireflection-coated facet emitting a light beam along an optical path, and a second, reflective or partially reflective facet. A linear polarizing beam splitter element is positioned in the optical path, with a non-reciprocal rotator element positioned in the optical path after the linear polarizing element, and with a reciprocal rotator element positioned in the optical after the non-reciprocal rotator element. A grating is positioned in the optical path after the reciprocal rotator, followed by an end tuning reflector or mirror. The end reflector and the reflective facet of the gain medium define an external laser cavity. The order of the non-reciprocal rotator and the reciprocal rotator elements positioned between the polarizing beam splitter and the grating element may be reversed, with the non-reciprocal rotator positioned after the reciprocal rotator.

In operation, the gain medium outputs light that includes source spontaneous emission (SSE) and amplified spontaneous emission (ASE) associated with current pumping of the gain medium. Light returned or fed back along the optical path to the gain medium from the grating element is spectrally pure at the wavelength selected by the tunable element, with the SSE or ASE light components having been substantially removed by the grating. The polarization-dependent beam splitter passes linearly polarized light from the gain medium (which contains SSE and/or ASE components) along the optical path to the non-reciprocal and reciprocal rotators. The polarization dependent beam splitter does not reflect or substantially reflect the outward-bound light from the gain medium from the optical path, which allows for a greater amount of spectrally clean light to ultimately be returned back towards the gain medium.

The non-reciprocal and reciprocal rotators are configured to provide a "balanced" rotator pair to the light traveling outward from the gain medium and polarizing beam splitter towards the grating or other wavelength selection element, such that each rotator provides an equal, but opposite, amount of polarization rotation to the light beam. The net effect of the non-reciprocal and reciprocal rotator pair on the linearly polarized light traveling towards the grating is zero rotation, i.e., the polarization orientations introduced by the rotators effectively cancel each other out. In this manner, the light traveling towards the grating is optimally polarized for effective diffraction by the grating.

As spectrally clean light is returned along the optical path from the grating towards the gain medium, the non-reciprocal and reciprocal rotators act additively and impart in a net change in polarization orientation to the light beam. The polarization-dependent beam splitter passes only a portion of this returning light of changed polarization orientation, and the remainder of the returning light is non-reciprocally reflected or picked off by the polarizing beam splitter as spectrally pure optical output. This spectrally pure output is directed down an output path and may be coupled into a fiberoptic. The proportion of light that is non-reciprocally picked off rather than returned to the gain medium may be controlled by selection of rotation angle provided by the rotator pair.

In other embodiments wherein a grating is used for a wavelength selection element, the polarizing beam splitter and gain medium may be rotationally oriented with respect to the non-reciprocal rotator by an amount equal to the rotation of polarization orientation provided by the non-reciprocal rotator. In this configuration, the gain medium and polarizing beam splitter provide the effect of a reciprocal rotator and eliminate the need for a separate reciprocal rotator. Alternatively, the rotational orientation of the grating with respect to the non-reciprocal rotator may be varied to accommodate the polarization rotation introduced by the non-reciprocal rotator.

In embodiments of the invention that use wavelength selection elements which are not polarization dependent, such as interference filters and etalon tuners, the reciprocal rotator may be omitted, as the polarization orientation of the outbound light beam does not effect tuning efficiency. Thus, the apparatus of the invention may be embodied in an external cavity laser apparatus comprising a diode gain medium emitting a light beam along an optical path, a polarizing beam splitter element positioned in the optical path, a non-reciprocal polarization rotator positioned in the optical path after the polarizing beam splitter, a tunable filter positioned in the optical path after the non-reciprocal rotator, and an end reflector positioned in the optical path after the tunable filter. In operation, the light beam traveling outward from the gain medium is linearly polarized by the polarizing beam splitter, and then has its polarization orientation rotated by the non-reciprocal beam splitter. The outward beam then passes through the tunable filter, reflects off the end mirror and returns through the tunable filter. The spectrally clean return beam is then further rotated in its polarization orientation by the non-reciprocal rotator, after which the polarizing beam splitter picks off a portion of the spectrally clean return beam and directs this portion down an output path. The remainder of the return beam is fed back to the gain medium.

The use of a non-reciprocal pickoff as provided by the invention provides a spectrally pure laser output of relatively high power with minimal intracavity loss. The non-reciprocal pickoff of the invention utilizes simple, inexpensive optical components that have large alignment tolerances, and which are suitable for very broad-band applications. Other objects and advantages of the invention will be apparent from the detailed description below.

BRIEF DESCRIPTION OF THE DRAWINGS

The invention will be more fully understood by reference to the following drawings, which are for illustrative purposes only.

DETAILED DESCRIPTION OF THE INVENTION

Figure 1:
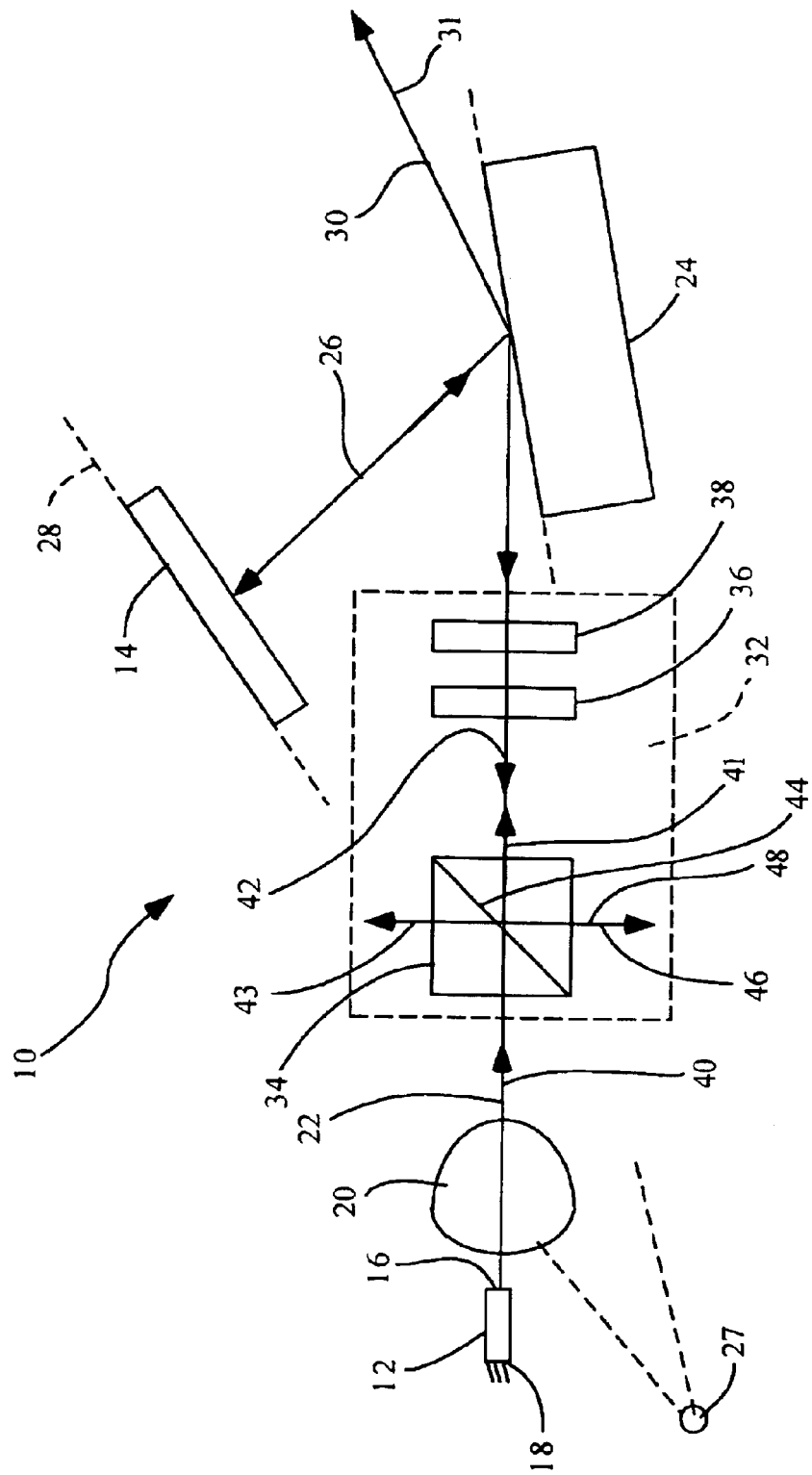
FIG. 1 is schematic diagram of a laser apparatus with a non-reciprocal pickoff in accordance with the invention.
Figure 2:
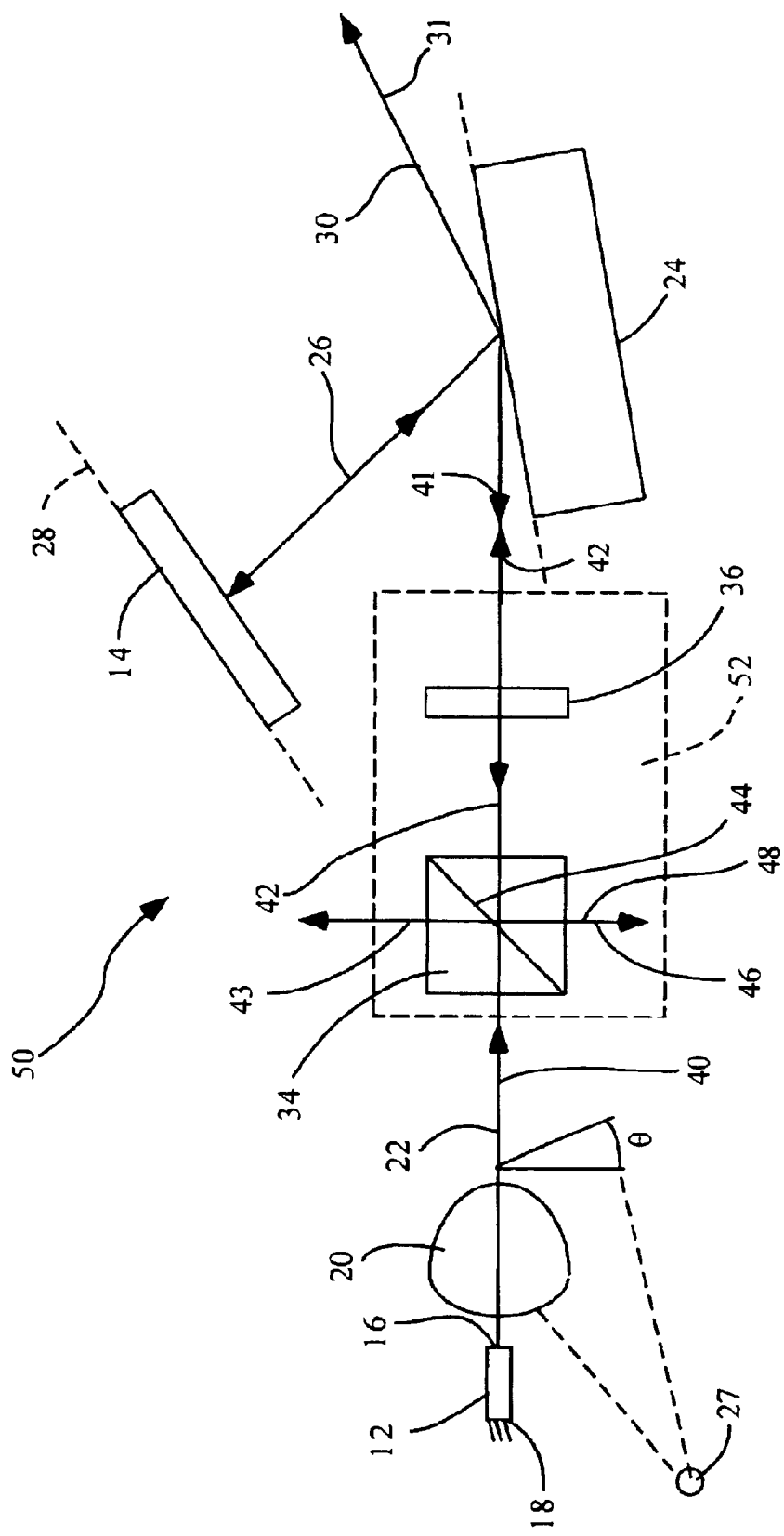
FIG. 2 is schematic diagram of another embodiment of a laser apparatus with a non-reciprocal pickoff in accordance with the invention.
Figure 3:
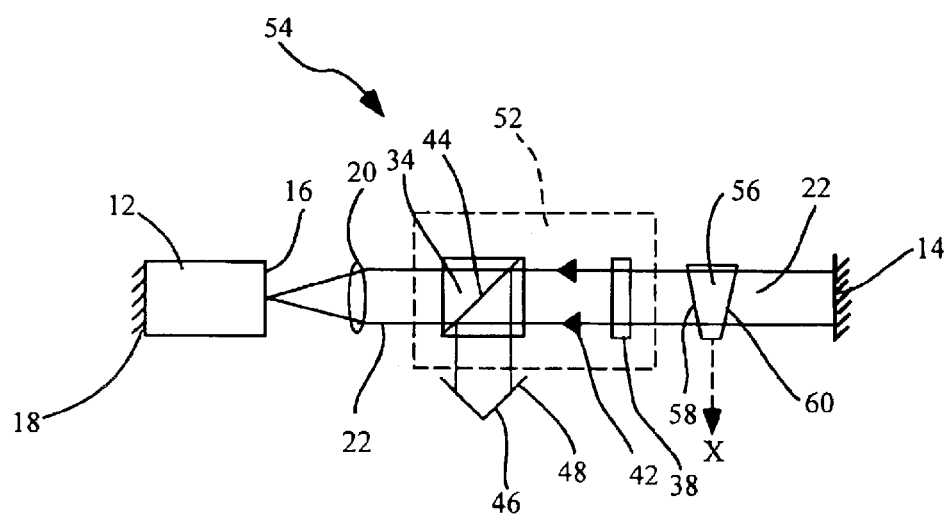
FIG. 3 is schematic diagram of yet another embodiment of a laser apparatus with a non-reciprocal pickoff in accordance with the invention.

Referring more specifically to the drawings, for illustrative purposes the present invention is embodied in the apparatus shown in FIG. 1 through FIG. 3. It will be appreciated that the apparatus may vary as to configuration and as to details of the parts, and that the method may vary as to details and the order of the acts, without departing from the basic concepts as disclosed herein. The invention is disclosed primarily in terms of use with an external cavity laser. The invention, however, may be used with various types of laser devices and optical systems. It should also be understood that the terminology used herein is for the purpose of describing particular embodiments only, and is not intended to be limiting, since the scope of the present invention will be limited only by the appended claims.

Referring now to FIG. 1, there is shown a laser apparatus 10 in accordance with the invention. The apparatus 10 includes a gain medium 12 and an end or external reflective element or retroreflector 14. Gain medium 12 may comprise a conventional Fabry-Perot diode emitter chip with an anti-reflection (AR) coated front output facet 16 and a reflective or partially reflective rear facet 18. An external laser cavity is defined or delineated by rear facet 18 and end reflector 14. Gain medium 12 emits a coherent beam from front facet 16 that is collimated by lens 20 and directed along an optical path 22 to a wavelength selection element that is shown in FIG. 1 as a tunable diffraction element or tuning-grating 24. Other types of tuning element may be used with the invention, as described further below. Light diffracted from tuning-grating 24 travels along optical path 26 to the end reflector 14, which reflects light back to tuning-grating 24. Tuning-grating 24 returns the light reflected off end reflector 14 along optical path 22 to gain medium 12. The arrangement of gain medium 12, tuning-grating 24 and end reflector 14 result in a "folded cavity" having an optical cavity path length equal to the sum of optical paths 22, 26.

End reflector 14 is mounted on a movable arm (not shown) that pivotally moves with respect to a pivot point 27 such that the angular relationship of the plane 28 is defined by the reflective surface of reflector 14. The diffraction received by reflector 14 from grating 24 is varied by the pivotal movement of reflector 14 with respect to pivot point 27. Angular motion of end reflector 14 with respect to tuning-grating 24 in this manner results in changing the particular diffraction that is received by reflector 14 from grating 24 and which is then reflected back to grating 24, and hence to gain medium 12. The angular motion of reflector 14 with respect to grating 24 thus allows tuning or adjusting of the wavelength of the light that is fed back into gain medium 12.

Movement of end reflector 14 with respect to pivot point 27 results in both angular and translational motion of end reflector 14, and the location of pivot point 27 and positioning of end reflector 14 with respect to pivot point 27 may be selected to couple optical cavity length adjustment to wavelength selection to provide mode-hop free optical output. A variety of positional adjustment systems may be used for the movement of end reflector 14 with respect to grating 24. Such systems may utilize, for example, a stepper motor to physically drive the pivot arm supporting reflector 14, together with a linear encoder and/or motor rotational encoder to track movement of the pivot arm, and a control device to selectively control the positioning of the pivot arm and reflector 14 according to selected output wavelengths.

Optical output of the external cavity laser apparatus 10 may be collected as output 30 along a path 31 that is provided by the grating reflection of light directly from the gain medium 12. Output beam 30 provides conventional output that can have relatively high power from the external cavity laser 10, but which includes "noise" in the form of source spontaneous emission (SSE) and amplified spontaneous emission (ASE) from the gain medium 12. The SSE and ASE result in a spontaneous emission component in the output beam 30 in the form of low intensity, incoherent light that is delivered along output path 31 together with coherent light at the wavelength selected according to the positional relationship of reflector 14 and grating 24. Light returning from reflector 14 towards grating 24, and from grating 24 towards gain medium 12, has been spectrally "cleansed" by the action of grating 24 and reflector 14 to remove the SSE and ASE components, and includes only light at a selected or tuned wavelength.

Laser apparatus 10 comprises a non-reciprocal pickoff 32 positioned in optical path 22 between gain medium 12 and tuning-grating 24. Non-reciprocal pickoff 32, in the embodiment of FIG. 1, includes a polarization-dependent beam splitter 34 positioned in the optical path 22, a non-reciprocal polarization rotator 36 positioned in the optical path 22 after the polarization-dependent beam splitter 34, and a reciprocal polarization rotator 38 positioned in the light beam after the non-reciprocal polarization rotator 36. Polarizing beam splitter 34 may comprise, for example, a near-Brewster angle thin film dielectric polarizer plate or other type of linear polarizer. Non-reciprocal rotator 36 may comprise a Faraday rotator based on bismuth iron garnet (BIG), terbium gallium garnet (TGG) or like material. Reciprocal rotator 36 may comprise a quartz crystal rotator or like device.

Grating 24 includes a plurality of parallel grooves (not shown) etched on its diffraction surface, and the polarization dependent beam splitter 34 is positioned to pass the light beam 40 traveling outward from gain medium 12 along optical path 22 as linearly polarized light 41 with a polarization orientation that is optimal for effective diffraction by grating 24. The non-reciprocal polarization rotator 36 and the reciprocal polarization rotator 38 are substantially balanced with respect to each other, such that the non-reciprocal polarization rotator 36 and the reciprocal polarization rotator 38 each define substantially equal angles of polarization rotation. The non-reciprocal and reciprocal polarization rotators 36, 38 are oriented and configured to cancel out each other's rotational effect on the outward bound polarized light beam 41. In other words, the non-reciprocal rotator 36 is configured to introduce a polarization rotation of $+\theta$ degrees, while reciprocal rotator introduces a polarization rotation of $-\theta$ degrees, resulting in zero net change in polarization orientation on the outward light beam 41. In this manner, the polarization orientation of the outward traveling light beam 41, when it reaches grating 24, is unchanged by the action of non-reciprocal and reciprocal polarization rotators 36, 38, and remains optimally oriented for diffraction by grating 24.

The non-reciprocal and reciprocal polarization rotators 36, 38 are oriented and configured to produce an additive rotational effect on the spectrally clean returning light beam 42 traveling from grating 24 towards the gain medium 12. In the return direction, the non-reciprocal and reciprocal polarization rotators 36, 38 each introduce a rotation of $+\theta$ degrees to provide a net rotation of $+2\theta$ degrees to returning light beam 42.

The canceling effect of non-reciprocal and reciprocal polarization rotators 36, 38 on outward traveling light beam 40, together with the additive effect of non-reciprocal and reciprocal polarization rotators 36, 38 on the return light beam 42, allows for picking or reflecting off a portion of the spectrally clean return beam 42 from optical path with nominally zero intracavity optical loss associated with the pickoff. The pickoff is non-reciprocal in that the polarizer plate 44 defined by beam splitter 34 effectively passes linearly polarized light 41 (which contains SSE and/or ASE components) from the gain medium 12 along the optical path 22 with nominally zero reflection from beam splitter 34 along path 43. This action is unlike that of a conventional beam coupler or beam splitter, which would reflect a portion of the light beam 40 along optical path 43 as optical loss. The spectrally cleaned return beam 42, having been changed in polarization orientation by $2\theta$ degrees by the action of rotators 36, 38, can be non-reciprocally picked off and used as spectrally clean optical output 46 directed along output path 48 by polarizing beam splitter 34. The output beam 46 may be directed through a collimating lens (not shown) and focused into an optical fiber (not shown) in a conventional manner.

The proportion of light that is non-reciprocally picked off by polarizing beam splitter 34 rather than returned to the gain medium 12 may be controlled by selection of rotation angles provided by the rotator pair 36, 38. Polarizing beam splitter 34 will pick off or reflect $\sin^2(2\theta)$ as output 46 along path 48, and will pass or return $\cos^2(2\theta)$ along optical path 22 to gain medium 12. Rotators 36, 38 should generally be configured to return or feedback a sufficient amount of light to gain medium 12 to maintain stable output from gain medium 12. The remainder of the return light may be non-reciprocally picked off as spectrally pure output as described above. Various rotation angle configurations for rotators 36, 38 may be used to vary the output-feedback ratio as required.

It should be noted that a portion of the output of gain medium 12 will also exit the external laser cavity as the reflection 30 off grating 24 along path 31. This output, which contains ASE and SSE components, may be collimated and focused into a fiberoptic (not shown) for use.

In the embodiment shown in FIG. 1, the non-reciprocal pickoff 32 is positioned separately between grating 24 and gain medium 12. In other embodiments, non-reciprocal pickoff 32 may be positioned between end mirror 14 and grating 24. In all embodiments, non-reciprocal pickoff 32 is positioned such that polarizing-dependent beam splitter 34 picks off a portion of light wherein the ASE and/or SSE components have been separated from the light of the selected wavelength by the action of grating 24. Numerous variations on the position and arrangement of polarizing beam splitter 34 and rotators 36, 38 can be used to provide for non-reciprocal pickoff of a portion of spectrally cleaned light from within the optical cavity of the apparatus 10, and such variations are considered to be within the scope of this invention.

Referring now to FIG. 2, there is shown an alternative embodiment laser apparatus 50 in accordance with the invention, wherein like reference numbers are used to denote like parts. The apparatus 50 includes an non-reciprocal pickoff 52 that comprises a polarization-dependent beam splitter 34 and a non-reciprocal polarization rotator 36. In the embodiment of FIG. 2, gain medium 12 and polarization-dependent beam splitter 34 each are angularly positioned or rotated by $-\theta$ degrees with respect to non-reciprocal polarization rotator 36, as well as the optical axis (optical path 22) of the external laser cavity defined by reflector 14 and gain medium facet 18. The orientation of gain medium 12 and polarization-dependent beam splitter 34 effectively provides the same effect as a reciprocal polarization rotator to the linearly polarized outward traveling light beam 41, thus eliminating the need for a separate reciprocal polarization rotator as used in the apparatus 10 of FIG. 1.

In operation of the apparatus 50, the linearly polarized outward beam 41, upon exiting polarizing beam splitter 34, has a polarization orientation of $-\theta$ degrees. There is no loss along path 43, as polarizing beam splitter 34 and gain medium 12 are oriented to effectively pass linearly polarized beam 41. The non-reciprocal polarization rotator imparts a polarization rotation of $+\theta$ degrees to the outward traveling beam 41, to result in zero net polarization rotation to the outward traveling beam as it reaches grating 24, leaving the beam with optimal polarization orientation for diffraction be grating 24. The returning beam 42 is again rotated by $+\theta$ degrees by the non-reciprocal rotator 36 such that the returning beam 42 has been rotated in polarization orientation by $+2\theta$ degrees when it reaches polarizing beam splitter 34. This change in polarization orientation allows polarizing beam splitter 34 to non-reciprocally pick off a portion or the spectrally clean return beam 41 in the manner described above. The proportion of the return beam 42 that is picked off by polarization dependent beam splitter 34 is angle-dependent, as noted above, and can be controlled as desired by selecting the orientation of gain medium 12 and beam splitter 34 with respect to the optical axis along path 22, and/or the amount of polarization rotation introduced by non-reciprocal rotator 36.

In a variation of the apparatus 50, grating 24 may be rotated by +θ degrees with respect to non-reciprocal rotator 36 and the optical axis of the laser external cavity. Thus, when outward beam 41 has been rotated by +θ degrees by non-reciprocal rotator 36, grating 24 will still be optimally aligned for diffraction of beam 41. The return beam 42 is again rotated by +θ degrees by non-reciprocal rotator 36, and thus is rotated by +2θ degrees when it reaches polarizing beam splitter 34, thereby allowing non-reciprocal pickoff of a portion of the return beam 42 in the manner described above. Various other external cavity laser configurations that can employ the inventive features disclosed herein will suggest themselves to those skilled in the art upon review of this disclosure, and are considered to be within the scope of this disclosure. Various types of gratings used in transmission or reflection mode may be used, and may be chirped or un-chirped in different embodiments.

The apparatus and methods of the invention may employ wavelength selection elements other than grating devices that provide for wavelength selection as well as separation of spontaneous emission light from light of the selected wavelength. Referring to FIG. 3, there is shown yet another embodiment laser apparatus 54 in accordance with the invention, with like reference numbers used to denote like parts. In the apparatus 54, a tapered or wedge-shaped etalon 56 is used as a wavelength selection element. In operation, facet 16 of gain medium 12 emits a beam along optical path 22 to etalon 56. Etalon 56 includes first and second faces 58, 60 that are each partially reflective and partially transmissive, so that etalon 56 acts as an interference filter that is tunable by varying the position of etalon 56 along axis x. An end mirror or reflector 14, together with facet 18 of gain medium 12, defines an external laser cavity. Spectrally clean light, from which ASE and SSE components have been removed by the action of etalon 56, is returned as beam 42 to gain medium 12 to provide feedback thereto at a selected wavelength.

Etalon 56 may comprise a solid or gas-filled etalon, an air gap etalon, an etalon comprising an electro-optic material, or a thin film interference filter. Various types of etalon tuning elements, including thin film interference filters, solid and gas etalons, and etalons made of liquid crystalline materials that are usable with the invention, are described in U.S. patent application Ser. No. 09/814,646 filed on Mar. 21, 2001, the disclosure of which is incorporated herein by reference.

A non-reciprocal pickoff 52, which includes a non-reciprocal rotator 36 a polarization-dependent beam splitter 34, is positioned in optical path 22 to pick off a portion of the light beam 42 returning from etalon 56 to gain medium 12. The tuning effect provided by etalon 56, unlike grating 24 described above, is not polarization dependent, and there is no need to "balance" the polarization rotation of the outward traveling linearly polarized beam 41 or otherwise orient the polarization of the beam 41 prior to interaction of beam 41 with etalon 56. In operation, the linearly polarized outward traveling beam 41 is passed by polarizing beam splitter 34 without loss along optical path 43 as described above. Beam 41 is rotated by +θ degrees non-reciprocal rotator 36 and reaches etalon 56 with this polarization orientation. The spectrally filtered return beam 42 is again rotated by +θ degrees by non-reciprocal rotator 36, such that return beam 42 has been rotated in polarization orientation by +2θ degrees when it reaches polarizing beam splitter 34. Polarizing beam splitter 34 picks off a portion of the return beam 42 equal to $\sin^2(2\theta)$ as described above, and passes the remainder of beam 42 to gain medium 12 as feedback. The light picked off by polarizing beam splitter 34 is directed along output path 48 as a high power optical output 46 from which ASE and SSE light components have been removed.

The degree or percent of reflectivity of end reflector 14 and/or gain medium facet 18 in the apparatus 54 of FIG. 3 may be varied to vary the relative power of output beam 46 and provide for additional outputs from the apparatus 54. Thus, for example, in certain embodiments reflector 14 and facet 18 can be completely reflective or almost completely reflective such that most or all of the output power of the apparatus 54 is provided as spectrally clean output beam 46 along output path 48. Where reflector 14 and/or facet 18 are partially reflective, laser output may additionally be obtained as output through reflector 14 and/or facet 18.

While the present invention has been described with reference to the specific embodiments thereof, it should be understood by those skilled in the art that various changes may be made and equivalents may be substituted without departing from the true spirit and scope of the invention. In addition, many modifications may be made to adapt a particular situation, material, composition of matter, process, process step or steps, to the objective, spirit and scope of the present invention. All such modifications are intended to be within the scope of the claims appended hereto.

What is claimed is:

1. A laser apparatus, comprising
   (a) a gain medium having first and second facets, said gain medium emitting a light beam from said first facet along an optical path;
   (b) a wavelength selection element positioned in said light beam;
   (c) a reflector positioned in said optical path after said wavelength selection element, said reflector and said second facet of said gain medium defining an external laser cavity; and
   (d) a non-reciprocal pickoff positioned in a position selected from the group consisting of a position between said wavelength selection element and said reflector, and a position between said first facet and said wavelength selection element, in said light beam, said non-reciprocal pickoff being configured to pick off a portion of spectrally clean light in said external laser cavity returning from said reflector and to output said portion of spectrally clean light along a path different from said optical path as spectrally clean laser output.

2. The laser apparatus of claim 1, wherein said non-reciprocal pickoff comprises:
   a linear polarizer positioned in said light beam between said gain medium and said wavelength selection element; and
   a non-reciprocal polarization rotator positioned in said light beam between said linear polarizer and said wavelength selection element.

3. The laser apparatus of claim 2, wherein said non-reciprocal pickoff further comprises a reciprocal polarization rotator positioned in said light beam between said linear polarizer and said wavelength selection element.

4. The laser apparatus of claim 2, wherein said gain medium and said linear polarizer are angularly positioned with respect to an said non-reciprocal polarization rotator at an angle that is substantially equal to an angle of rotation defined by said non-reciprocal rotator.

5. The laser apparatus of claim 3, wherein said non-reciprocal polarization rotator and said reciprocal polarization rotator are balanced with respect to each other.

6. The laser apparatus of claim 3, wherein said non-reciprocal polarization rotator and said reciprocal polarization rotator each define substantially equal angles of polarization rotation.

7. The laser apparatus of claim 1, wherein said reflector comprises an end reflector.

8. The laser apparatus of claim 1, wherein said wavelength selection element comprises a grating.

9. The laser apparatus of claim 1, wherein said wavelength selection element comprises an etalon.

10. The laser apparatus of claim 2, wherein said wavelength selection element is angularly positioned with respect to said non-reciprocal polarization rotator at an angle that is substantially equal to an angle of rotation defined by said non-reciprocal rotator.

11. The laser apparatus of claim 1, wherein said wavelength selection element is tunable.

12. A laser apparatus, comprising:
(a) a gain medium having first and second facets, said gain medium emitting a light beam from said first facet along an optical path;
(b) a wavelength selection element positioned in said optical path and configured to feed back light to said gain medium;
(c) a reflector positioned in said optical path after said wavelength selection element, said reflector and said second facet of said gain medium defining an external laser cavity; and
(d) a non-reciprocal pickoff positioned in said optical path before said wavelength selection element, said non-reciprocal pickoff being configured to pick off a portion of spectrally clean light in said external laser cavity returning from said reflector and output said portion of spectrally clean light along a path different from said optical path as spectrally clean laser output.

13. The laser apparatus of claim 12, wherein said non-reciprocal pickoff comprises:
a linear polarizer positioned in said optical path before said wavelength selection element; and
a non-reciprocal polarization rotator positioned in said optical path after said linear polarizer and before said wavelength selection element.

14. The laser apparatus of claim 13, wherein said non-reciprocal pickoff further comprises a reciprocal polarization rotator positioned in said optical path after said linear polarizer and before said wavelength selection element.

15. The laser apparatus of claim 14, wherein said gain medium and said linear polarizer are angularly positioned with respect to said non-reciprocal polarization rotator at an angle that is substantially equal to an angle of rotation defined by said non-reciprocal polarization rotator.

16. The laser apparatus of claim 14, wherein said non-reciprocal polarization rotator and said reciprocal polarization rotator are balanced with respect to each other.

17. The laser apparatus of claim 14, wherein said non-reciprocal polarization rotator defines an angle of polarization rotation substantially equal to that of said reciprocal rotator.

18. The laser apparatus of claim 13, wherein said wavelength selection element is angularly positioned with respect to an said non-reciprocal polarization rotator at an angle that is substantially equal to an angle of rotation defined by said non-reciprocal rotator.

19. The laser apparatus of claim 12, wherein said wavelength selection element comprises a grating.

20. The laser apparatus of claim 12, wherein said wavelength selection element comprises an etalon.

21. The laser apparatus of claim 13, wherein said linear polarizer comprises a polarizing beam splitter.

22. The laser apparatus of claim 13, wherein said non-reciprocal polarization rotator comprises a Faraday rotator.

23. The laser apparatus of claim 12, wherein said wavelength selection element is tunable.

24. A method of laser operation, comprising:
(a) emitting a light beam from a gain medium along an optical path;
(b) positioning a wavelength selection element in said optical path;
(c) positioning a non-reciprocal pickoff in said optical path between said gain medium and said wavelength selection element;
(d) feeding light back to said gain medium by said wavelength selection element; and
(e) picking off, by said non-reciprocal pickoff, a portion of light traveling said optical path from said wavelength selection element towards said gain medium, and outputting the portion having been picked off along a path different from the optical path as spectrally clean laser output.

25. The method of claim 24, wherein said positioning said non-reciprocal pickoff comprises:
positioning a polarization-dependent beam splitter in said optical path between said gain medium and said wavelength selection element; and
positioning a non-reciprocal polarization rotator in said optical path between said polarization-dependent beam splitter and said wavelength selection element.

26. The method of claim 25, further comprising angularly positioning said polarization-dependent beam splitter and said gain medium with respect to each other at an angle that is substantially equal to the angle of polarization rotation defined by said non-reciprocal polarizer.

27. The method of claim 25, wherein said positioning said non-reciprocal pickoff further comprises positioning a reciprocal polarization rotator in said optical path between said polarization-dependent beam splitter and said tunable element.

28. The method of claim 24, further comprising positioning a reflector in said optical path after said wavelength selection element.

29. The method of claim 28, further comprising defining an external laser cavity between said reflector and a reflective facet of said gain medium.

30. The method of claim 24, further comprising tuning said wavelength selection element to select wavelength of said light fed back to said gain medium.

31. A method for generating spectrally clean laser output, comprising:
(a) emitting a light beam from a gain medium outward along an optical path;
(b) allowing said outward light beam to interact with a tunable element;
(c) returning a spectrally cleaned light beam along said optical path to said gain medium from said tunable element; and (d) non-reciprocally picking off a portion of said returning, spectrally cleaned light beam, at a location between said gain medium and said tunable element, from said optical path and directing said portion along an output path as spectrally clean laser output.

32. The method of claim 31, wherein said non-reciprocally picking off comprises:

passing said outward light beam through a linear polarizer;

passing said outward light beam through a non-reciprocal polarization rotator and a reciprocal polarization rotator;

passing said returning, spectrally cleaned light beam through said non-reciprocal polarization rotator and said reciprocal polarization rotator; and picking off said portion of said returning, spectrally cleaned light beam by said linear polarizer.

33. The method of claim 32, wherein said passing said outward light beam through said non-reciprocal polarization rotator and said reciprocal polarization rotator comprises:

rotating, by said non-reciprocal polarization rotator, polarization orientation of said outward light beam by an amount equal to $\theta$; and rotating, by said reciprocal polarization rotator, said polarization orientation of said outward light beam by an amount equal to $-\theta$.

34. The method of claim 33, wherein said passing said returning, spectrally cleaned light beam through said non-reciprocal polarization rotator and said reciprocal polarization rotator comprises:

rotating, by said reciprocal polarization rotator, polarization orientation of said outward light beam by an angle $\theta$; and rotating, by said non-reciprocal polarization rotator, said polarization orientation of said outward light beam by an angle $\theta$.

35. The method of claim 34, wherein said linear polarizer comprises a polarizing beam splitter.

36. The method of claim 33, further comprising defining said reciprocal polarization rotator by angularly orienting said gain medium and said polarization-dependent beam splitter with respect to each other by a selected angle.

37. A laser apparatus, comprising (a) gain means for emitting a light beam along an optical path;

(b) means for tuning said light beam positioned in said optical path; and (c) means for non-reciprocally picking off a portion of light returning from said tuning means to said gain means and directing the portion of light having been picked off along an output path different from said optical path as spectrally clean laser output, said non-reciprocally picking off means positioned in said optical path between said gain means and said tuning means.

38. The laser apparatus of claim 37, wherein said non-reciprocally picking off means comprises:

means for linearly polarizing said light beam polarization-dependent beam splitter positioned in said light beam; and means for non-reciprocally rotating polarization orientation of said light beam positioned in said light beam after said linearly polarizing means.

\* \* \* \* \*